United States Patent
Tanaka et al.

(10) Patent No.: US 10,260,939 B2
(45) Date of Patent: Apr. 16, 2019

(54) OPTICAL SENSOR HAVING LIGHT ENTRANCE PORTION SMALLER THAN LIGHT-RECEIVING ELEMENT

(71) Applicant: NITTO DENKO CORPORATION, Ibaraki-shi, Osaka (JP)

(72) Inventors: Naoyuki Tanaka, Ibaraki (JP); Yasuto Ishimaru, Ibaraki (JP); Yuichi Tsujita, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 58 days.

(21) Appl. No.: 15/326,702

(22) PCT Filed: Jul. 17, 2015

(86) PCT No.: PCT/JP2015/070474
§ 371 (c)(1),
(2) Date: Jan. 17, 2017

(87) PCT Pub. No.: WO2016/017444
PCT Pub. Date: Feb. 4, 2016

(65) Prior Publication Data
US 2017/0211971 A1    Jul. 27, 2017

(30) Foreign Application Priority Data
Jul. 31, 2014    (JP) .................................. 2014-156330

(51) Int. Cl.
*G01J 1/04* (2006.01)
*G02B 6/42* (2006.01)
(Continued)

(52) U.S. Cl.
CPC ........... *G01J 1/0425* (2013.01); *G01J 1/0204* (2013.01); *G01J 1/0209* (2013.01); *G01J 1/0403* (2013.01);
(Continued)

(58) Field of Classification Search
CPC ...... G01J 1/0425; G01J 1/0204; G01J 1/0403; G01J 1/4204
(Continued)

(56) References Cited

U.S. PATENT DOCUMENTS 4,302,070 A    11/1981    Nakayama et al.
4,386,268 A    5/1983    Kock
(Continued)

FOREIGN PATENT DOCUMENTS

CN    101441298 A    5/2009
CN    102023348 A    4/2011
(Continued)

OTHER PUBLICATIONS

Office Action dated Feb. 27, 2018, issued in counterpart Japanese Application No. 2014-156330, with English translation. (5 pages).
(Continued)

*Primary Examiner* — Que Tan Le
(74) *Attorney, Agent, or Firm* — Westerman, Hattori, Daniels & Adrian, LLP

(57) ABSTRACT

There is provided an optical sensor in which a reduction in size of a light-receiving part is achieved. This optical sensor is installed in a device, and includes a light-receiving element 4 for receiving light coming from outside toward the device. The optical sensor detects the state of the received light. A linear optical waveguide 2 is connected to the light-receiving element 4 so as to be capable of light propagation. The optical waveguide 2 has a front end portion serving as a light entrance portion on which light coming from the outside of the device is incident.

2 Claims, 3 Drawing Sheets

(51) Int. Cl.
*H01L 31/0232* (2014.01)
*G01J 1/02* (2006.01)
*G01J 1/42* (2006.01)

(52) U.S. Cl.
CPC .......... *G01J 1/0407* (2013.01); *G01J 1/0414* (2013.01); *G01J 1/4204* (2013.01); *G02B 6/42* (2013.01); *H01L 31/0232* (2013.01)

(58) Field of Classification Search
USPC .................................................... 250/227.14
See application file for complete search history.

(56) References Cited

U.S. PATENT DOCUMENTS

| | | | | |
|---|---|---|---|---|
| 4,933,545 | A | * | 6/1990 | Saaski .................. G01L 9/0079 250/227.14 |
| 5,389,783 | A | * | 2/1995 | Shionoya ........... G02B 21/0032 250/234 |
| 8,915,657 | B2 | | 12/2014 | Inoue et al. |
| 2009/0127577 | A1 | | 5/2009 | Hodono |
| 2011/0064354 | A1 | | 3/2011 | Nishio et al. |
| 2012/0251036 | A1 | | 10/2012 | Inoue et al. |
| 2017/0133544 | A1 | * | 5/2017 | Tanaka .................. H01L 31/167 |

FOREIGN PATENT DOCUMENTS

| | | |
|---|---|---|
| CN | 102736171 A | 10/2012 |
| JP | 49-101638 U | 9/1974 |
| JP | 52-135690 A | 11/1977 |
| JP | 55-22713 A | 2/1980 |
| JP | 56-87374 U | 7/1981 |
| JP | 56-91459 U | 7/1981 |
| JP | 56-121272 U | 9/1981 |
| JP | 56-121381 U | 9/1981 |
| JP | 57-78159 U | 5/1982 |
| JP | 2009-128430 A | 6/2009 |
| JP | 2011-64910 A | 3/2011 |
| JP | 2012-208306 A | 10/2012 |
| JP | 2013-191834 A | 9/2013 |

OTHER PUBLICATIONS

International Search Report dated Sep. 8, 2015, issued in counterpart of International Application No. PCT/JP2015/070474 (1 Pages).
Office Action dated Oct. 9, 2017, issued in counterpart Chinese Application No. 2015800385083, with English translation. (10 pages).
Notification of Transmittal of Translation of the International Preliminary Report on Patentability (Form PCT/IB/338) issued in counterpart International Application No. PCT/JP2015/070474 dated Feb. 9, 2017, with Forms PCT/IB/373 and PCT/ISA/237. (5 pages).
Office Action dated Aug. 1, 2017, issued in counterpart Japanese Application No. 2014-156330, with English machine translation. (4 pages).
Office Action dated Jun. 22, 2018, issued in counterpart Chinese application No. 201580038508.3, with English translation. (8 pages).
Office Action dated Nov. 29, 2018, issued in counterpart Taiwanese Application No. 104123270, with English translation. (8 pages).

* cited by examiner

RELATED ART

OPTICAL SENSOR HAVING LIGHT ENTRANCE PORTION SMALLER THAN LIGHT-RECEIVING ELEMENT

TECHNICAL FIELD

The present invention relates to an optical sensor for detecting the brightness, color and the like of light.

BACKGROUND ART

An optical sensor which detects the state, such as brightness and color, of light has been hitherto proposed (see PTL 1, for example). As shown in FIG. 5, this optical sensor includes a light-receiving element 4, and is installed in a device while a light-receiving part of the light-receiving element 4 is oriented in the direction of light to be detected. The light-receiving element 4 receives the light, so that the optical sensor is capable of detecting the brightness, color and the like of the light. Such an optical sensor is installed, for example, in a television set, and is capable of detecting the brightness of a room in which the television set is placed. The optical sensor is capable of properly adjusting the brightness of the screen of the television set in accordance with the detected brightness of the room.

RELATED ART DOCUMENT

Patent Document

PTL 1: JP-A-2013-191834

SUMMARY OF INVENTION

There has been a demand for reduction in size of devices such as the aforementioned television set. However, when the light-receiving element 4 is directly used for the reception of light in the aforementioned optical sensor, there is a limit to the reduction in size of a part where the light-receiving element 4 is installed because of the size of the light-receiving element 4 itself, so that it is impossible to sufficiently meet the demand for further reduction in size of the aforementioned devices. In addition, the aforementioned light-receiving element 4 is mounted on an electrical substrate (not shown). The electrical substrate also becomes an impediment to the reduction in size. Further, the light-receiving element 4 is generally used as the optical sensor while being fixed by a fixing member 51 such as a case together with the electrical substrate. Thus, the whole size is further increased by the size of the fixing member 51. The light-receiving element 4 has the following dimensions: a width W0 of not less than 1.0 mm and a height T0 of not less than 0.3 mm, for example, inclusive of the electrical substrate on which the light-receiving element 4 is mounted. The dimensions of the fixing member 51 shown in FIG. 5 are as follows: part for fixing the light-receiving element 4 together with the electrical substrate has a width W1 of not less than 1.6 mm and a height T1 of not less than 0.53 mm. Further reduction in size has been desired.

In view of the foregoing, it is therefore an object of the present invention to provide an optical sensor in which a reduction in size of a light-receiving part is achieved.

To accomplish the aforementioned object, an optical sensor according to the present invention comprises: a light-receiving element; and a linear optical waveguide, the linear optical waveguide being connected to the light-receiving element so as to be capable of light propagation, the linear optical waveguide having a front end portion serving as a light entrance portion, the light entrance portion having a smaller size than the light-receiving element, the optical sensor being installed in a device, the light-receiving element being configured to receive light coming from outside toward the device and entering the light entrance portion, the optical sensor detecting the state of the received light.

The term "state of light" as used in the present invention shall be meant to include the brightness (intensity), color (wavelength) and the like of light.

In the optical sensor according to the present invention, light is not received by the light-receiving element, but is received by the front end portion of the linear optical waveguide, so that the reduction in size of the light-receiving part is achieved. Specifically, the front end portion of the linear optical waveguide connected to the light-receiving element is formed as the light entrance portion. Since the optical waveguide can be reduced in size, the reduction in size of the light-receiving part (light entrance portion of the optical waveguide) is achieved, as compared with the conventional light-receiving part (light-receiving element). In the optical sensor according to the present invention, the light-receiving element is connected through the optical waveguide to the light-receiving part. Thus, the light-receiving element may be disposed in a location where no influence is exerted on the reduction in size of the device. Therefore, the device in which the optical sensor according to the present invention is installed is reduced in size.

In particular, the optical sensor further comprises a fixing member fixing the light entrance portion of the optical waveguide, wherein the light-receiving element is disposed in spaced apart relationship with the fixing member. In such a case, part of the fixing member serves as the light-receiving part. The size of the fixing member can be reduced in corresponding relation to the size of the light entrance portion of the optical waveguide. This achieves the reduction in size of the light-receiving part. The light-receiving part is installed in the device by installing the fixing member in the device. This facilitates the installation. The light-receiving element is disposed in spaced apart relation to the fixing member. This allows the light-receiving element to be easily disposed in a location where no influence is exerted on the reduction in size of the device.

DESCRIPTION OF EMBODIMENTS

Next, embodiments according to the present invention will now be described in detail with reference to the drawings.

Figure 1A:
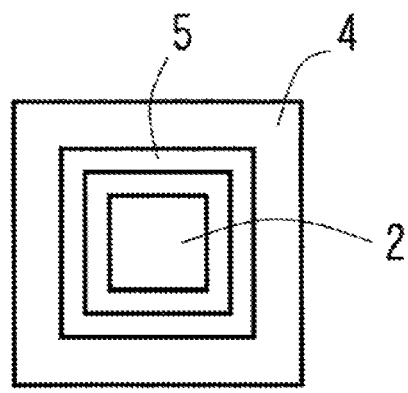
FIG. 1A is a schematic plan view of an optical sensor according to a first embodiment of the present invention.
Figure 1B:
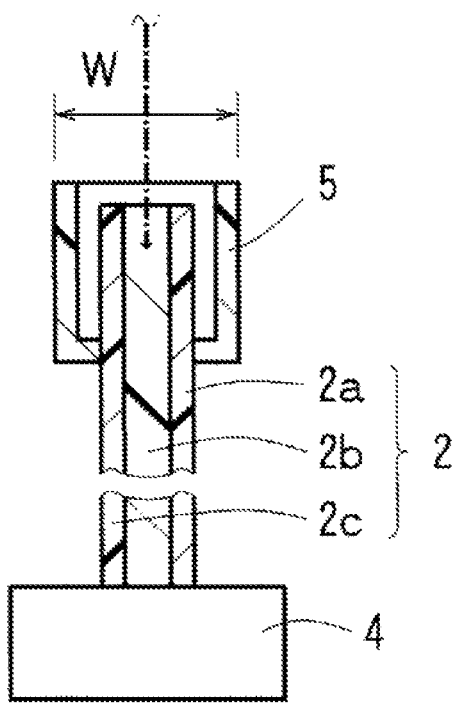
FIG. 1B is a schematic vertical sectional view thereof.

FIG. 1A is a plan view of an optical sensor according to a first embodiment of the present invention, and FIG. 1B is a vertical sectional view thereof. The optical sensor according to this embodiment includes: a light-receiving element 4 mounted on an electrical substrate (not shown); a linear optical waveguide 2 including a first end surface connected to the light-receiving element 4 so as to be capable of light propagation; and a fixing member 5 for fixing a second end portion (front end portion) of the optical waveguide 2 while allowing light to enter a second end surface (front end surface) of the optical waveguide 2. The optical sensor is installed in a device. Light coming from the outside of the device enters the front end surface of a core 2b of the optical waveguide 2, passes through the core 2b, and is received by the light-receiving element 4 (with reference to a dash-and-dot arrow in the figure). A first end portion (where the light-receiving element 4 is connected) of the optical waveguide 2 protrudes from the fixing member 5. The light-receiving element 4 is disposed in spaced apart relationship with the fixing member 5. In this embodiment, the optical waveguide 2 has a width less than the sum of the width of the light-receiving element 4 and the electrical substrate.

More specifically, the linear optical waveguide 2 in this embodiment is configured such that the single core 2b serving as an optical path is formed in the middle of a surface of an under cladding layer 2a, and such that an over cladding layer 2c is formed on the surface of the under cladding layer 2a so as to cover the core 2b.

Such an optical waveguide 2 has the flexibility of being able to bend freely. The thicknesses of the respective layers are as follows: the under cladding layer 2a has a thickness in the range of 1 to 50 μm; the core 2b has a thickness in the range of 1 to 100 μm; and the over cladding layer 2c has a thickness in the range of 1 to 50 μm (thicknesses as measured in the width direction of FIG. 1), for example.

The fixing member 5 fixes the front end portion (light entrance portion) of the core 2b while allowing light to enter the front end surface (light entrance surface) of the core 2b of the optical waveguide 2. The width of the fixing member 5 can be reduced, relative to that of the conventional art, in corresponding relation to the width of the front end portion (light entrance portion) of the optical waveguide 2. Thus, the reduction in size of a light-receiving part is achieved. This also achieves the reduction in size of the device in which the optical sensor is installed.

For example, the optical waveguide 2 having the front end portion with a total thickness (width) of 0.1 mm is produced in which the under cladding layer 2a has a thickness of 25 μm, the core 2b has a thickness of 50 μm, and the over cladding layer 2c has a thickness of 25 μm (thickness as measured in the width direction of FIG. 1). This allows the fixing member 5 to have a width W of 0.8 mm. This width W of the fixing member 5 is significantly reduced, as compared with the width W1 (not less than 1.6 mm) of the conventional fixing member 51 (with reference to FIG. 5) which fixes the light-receiving element 4.

Further, the light-receiving element 4 is connected by the optical waveguide 2, and is spaced from the fixing member (light-receiving part) 5. Thus, the light-receiving element 4 maybe disposed in spaced apart relation to the fixing member 5 and mounted on the electrical substrate which exerts no influence on the reduction in size of the device. This also contributes to the reduction in size of the device.

Examples of materials for the formation of the under cladding layer 2a, the core 2b and the over cladding layer 2c include polymer resins such as epoxy, acrylic, polyamide, polyimide, polycarbonate, polymethyl methacrylate and polystyrene, and silicone resins. The linear optical waveguide 2 may be produced by a manufacturing method depending on the materials. The core 2b has a refractive index higher than the refractive indices of the under cladding layer 2a and the over cladding layer 2c. The adjustment of the refractive indices may be made, for example, by adjusting the selection of the types of the materials for the formation of the core 2b, the under cladding layer 2a and the over cladding layer 2c, and the composition ratio thereof. Examples of a material for the formation of the fixing member 5 include photosensitive resins, thermosetting resins and metals. The fixing member 5 may be produced by a manufacturing method depending on the material.

Figure 2A:
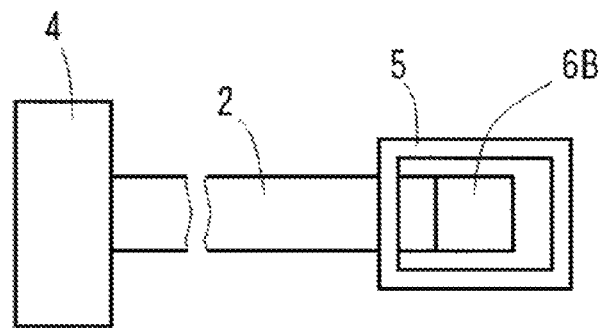
FIG. 2A is a schematic plan view of the optical sensor according to a second embodiment of the present invention.
Figure 2B:
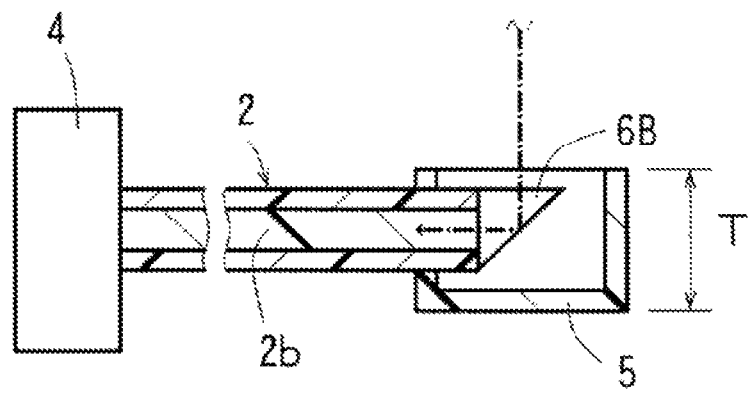
FIG. 2B is a schematic vertical sectional view thereof.

FIG. 2A is a plan view of the optical sensor according to a second embodiment of the present invention, and FIG. 2B is a vertical sectional view thereof. In the optical sensor according to this embodiment, an optical path changing member 6B such as a prism for changing an optical path by 90 degrees is provided on the front end surface of the optical waveguide 2 to form the front end portion of the optical waveguide 2. The optical path changing member 6B may be provided by bonding to the optical waveguide 2 with an adhesive agent or by transfer molding with the optical waveguide 2 by one operation. A surface (upper surface as seen in FIG. 2B) of part of the optical path changing member 6B serves as the light entrance surface. The front end portion of the optical waveguide 2 extends in a direction (leftward-rightward direction as seen in FIG. 2B) orthogonal to an incident light beam (with reference to a dash-and-dot arrow in the figure). The remaining parts of the second embodiment are similar to those of the first embodiment described above. Like reference numerals and characters are used in the second embodiment to designate parts similar to those of the first embodiment.

For example, when the optical waveguide 2 has a thickness (height) of 0.1 mm, this embodiment allows part of the fixing member 5 which fixes the front end portion of the optical waveguide 2 to have a height T of 0.33 mm. The height T of this part of the fixing member 5 is reduced, as compared with the height T1 (not less than 0.53 mm) of the part of the conventional fixing member 51 (with reference to FIG. 5) which fixes the light-receiving element 4. This achieves the reduction in size of the device in which the optical sensor is installed, as in the first embodiment.

Figure 3:
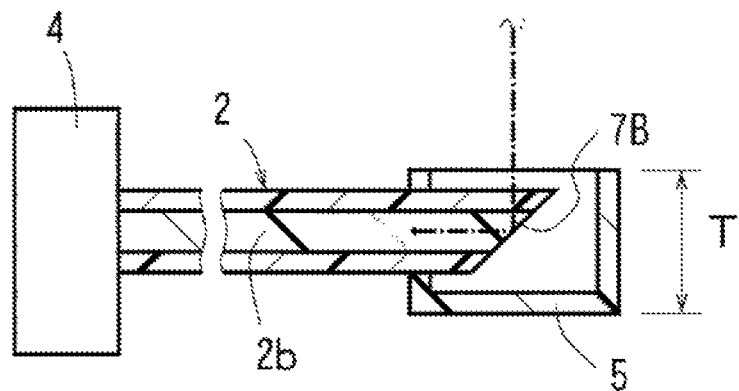
FIG. 3 is a schematic vertical sectional view of the optical sensor according to a third embodiment of the present invention.

FIG. 3 is a vertical sectional view of the optical sensor according to a third embodiment of the present invention. In the optical sensor according to this embodiment, an optical path changing part 7B for changing an optical path by 90 degrees is formed in the front end portion of the optical waveguide 2. This optical path changing part 7B includes an inclined surface at 45 degrees with respect to the longitudinal direction (light propagation direction) of the optical waveguide 2. Part of the inclined surface corresponding to the core 2b reflects light to change the optical path by 90 degrees (with reference to a dash-and-dot arrow in the figure). The inclined surface is formed by cutting the front end portion of the optical waveguide 2 by means of a cutting blade, laser beam machining and the like. The front end portion of the optical waveguide 2 extends in a direction (leftward-rightward direction as seen in FIG. 3) orthogonal to an incident light beam. The remaining parts of the third embodiment are similar to those of the second embodiment described above and shown in FIGS. 2A and 2B. Like reference numerals and characters are used in the third embodiment to designate parts similar to those of the second embodiment.

For example, when the optical waveguide 2 has a thickness (height) of 0.1 mm as in the second embodiment, this embodiment allows part of the fixing member 5 which fixes the front end portion of the optical waveguide 2 to have a height T of 0.33 mm. The height T of this part of the fixing member 5 is reduced, as compared with the height T1 (not less than 0.53 mm) of the part of the conventional fixing member 51 (with reference to FIG. 5). This achieves the reduction in size of the device in which the optical sensor is installed, as in the second embodiment.

Figure 4:
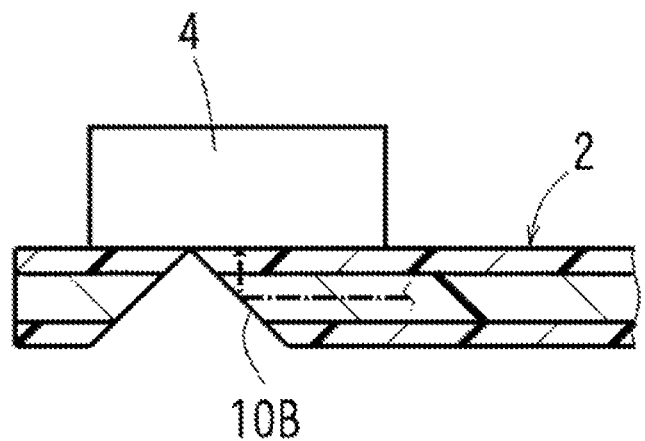
FIG. 4 is a schematic vertical sectional view of a modification of a connection configuration of a light-receiving element in the optical sensor.

In the first to third embodiments, the light-receiving element 4 is connected to the first end surface of the optical waveguide 2. Alternatively, as shown in vertical sectional view in FIG. 4, an optical path changing part 10B for changing an optical path by 90 degrees may be formed in the optical waveguide 2, and the light-receiving element 4 may be connected to a portion corresponding to the optical path changing part 10B. The optical path changing part 10B is similar to the optical path changing part 7B in the light entrance portion according to the third embodiment shown in FIG. 3.

In the first to third embodiments, the fixing member 5 is used to fix the front end portion of the optical waveguide 2. However, the shape of the fixing member 5 may be other than those shown in the figures, and is determined, as appropriate, depending on the device in which the fixing member 5 is installed. Further, the front end portion of the optical waveguide 2 may be fixed to the device without the use of the fixing member 5.

The optical sensor according to the first to third embodiments is used, for example, as an illuminance sensor, an RGB sensor, and the like.

Next, inventive examples of the present invention will be described in conjunction with a conventional example. It should be noted that the present invention is not limited to the inventive examples.

EXAMPLES

[Materials for Formation of Under Cladding Layer and Over Cladding Layer]

Materials for the formation of an under cladding layer and an over cladding layer were prepared by mixing 80 parts by weight of an aliphatic chain modified epoxy resin (EPICLON EXA-4816 available from DIC Corporation), 20 parts by weight of an aliphatic epoxy resin (EHPE3150 available from Daicel Corporation), 2 parts by weight of a photo-acid generator (SP170 available from ADEKA Corporation), and 40 parts by weight of ethyl lactate (a solvent available from Musashino Chemical Laboratory, Ltd.) together.

[Material for Formation of Core]

A material for the formation of a core was prepared by mixing 50 parts by weight of o-cresol novolac glycidyl ether (YDCN-700-10 available from Nippon Steel & Sumikin Chemical Co., Ltd.), 50 parts by weight of bisphenoxyethanolfluorene diglycidyl ether (OGSOL EG available from Osaka Gas Chemicals Co., Ltd.), 1 part by weight of a photo-acid generator (SP170 available from ADEKA Corporation), and 15 parts by weight of ethyl lactate (a solvent available from Musashino Chemical Laboratory, Ltd.) together.

[Optical Waveguide]

Using the aforementioned materials, a single strip-shaped core (with a width of 50 µm) having a thickness of 50 µm was formed in the middle of a surface of a strip-shaped under cladding layer (with a width of 0.1 mm) having a thickness of 25 µm so as to extend in the longitudinal direction of the under cladding layer, and an over cladding layer (with a thickness of 25 µm as measured from the upper surface of the core, and a width of 0.1 mm) was formed on the surface of the under cladding layer so as to cover the core. This provided a linear optical waveguide which has dimensions of 0.1 mm ×0.1 mm and is strip-shaped.

[Light-Receiving Element]

KPDG006HA1 available from Kyosemi Corporation was prepared as a light-receiving element, and mounted on an electrical substrate. The light-receiving element, including the electrical substrate, had the following dimensions: a width W0 of 1.0 mm, and a height T0 of 0.35 mm (with reference to FIG. 5).

Inventive Example 1

[Optical Sensor]

An optical sensor shown in FIGS. 1A and 1B was produced using the optical waveguide and the light-receiving element. A fixing member was made of a synthetic resin.

Inventive Example 2

[Optical Sensor]

An optical sensor shown in FIGS. 2A and 2B was produced in the same manner as in Inventive Example 1.

Inventive Example 3

[Optical Sensor]

An optical sensor shown in FIG. 3 was produced in the same manner as in Inventive Example v1.

Conventional Example

Figure 5:
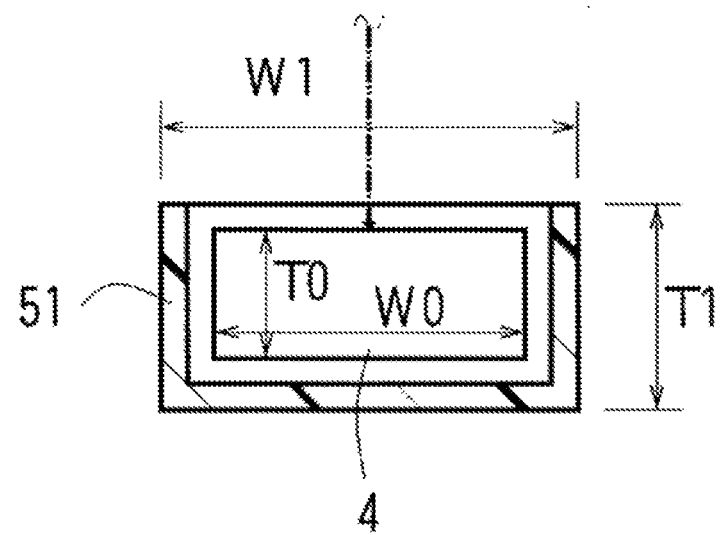
FIG. 5 is a schematic sectional view of a conventional optical sensor.

A conventional optical sensor shown in FIG. 5 was prepared.

[Measurement of Dimensions of Light-Receiving Part in Optical Sensor]

Dimensions of the fixing member in each of the optical sensors in Inventive Examples 1 to 3 and Conventional Example described above were measured. As a result, the width W of the fixing member in Inventive Example 1 was 0.8 mm; the height T of part of the fixing member in Inventive Example 2 was 0.33 mm; and the height T of part of the fixing member in Inventive Example 3 was 0.33 mm. The width W1 of part of the fixing member in Conventional Example was 1.6 mm; and the height T1 thereof was 0.53 mm.

It is found from the results of the measurement of the dimensions that the width W of the fixing member in Inventive Example 1 is less than the width W1 of the fixing member in Conventional Example and that the heights T of the respective fixing members in Inventive Examples 2 and 3 are less than the height T1 of the fixing member in Conventional Example. The aforementioned parts of the fixing members serve as a light-receiving part. It is therefore found that Inventive Examples 1 to 3 achieve a reduction in size of the light-receiving part, as compared with Conventional Example.

It has already been verified that light is properly received in each of the optical sensors in Inventive Examples 1 to 3.

Although specific forms in the present invention have been described in the aforementioned examples, the aforementioned examples should be considered as merely illustrative and not restrictive. It is contemplated that various modifications evident to those skilled in the art could be made without departing from the scope of the present invention.

The optical sensor according to the present invention is installed in devices and is applicable to the detection of the brightness, color and the like of light.

REFERENCE SIGNS LIST

2 Optical waveguide
4 Light-receiving element

The invention claimed is:

1. An optical sensor comprising:
a light-receiving element; and
a linear optical waveguide comprising a core, an under cladding layer and an overcladding layer, and
a fixing member,
wherein the linear optical waveguide is connected to the light-receiving element so as to be capable of light propagation,
wherein the linear optical waveguide has a front end portion serving as a light entrance portion, the light entrance portion having a smaller size than the light-receiving element,
wherein the fixing member fixes the light entrance portion while allowing light to enter a light entrance surface of the light entrance portion,
wherein the light-receiving element is disposed in spaced apart relationship with the fixing member,
wherein the light-receiving element is configured to receive light coming from outside toward the optical sensor and entering the light entrance portion, and
wherein the optical sensor detects the state of the received light.

2. The optical sensor according to claim 1,
wherein the fixing member has an internal space, and
wherein the light entrance surface of the light entrance portion is located in the internal space.

* * * * *